US007518222B2

(12) United States Patent
Ma et al.

(10) Patent No.: US 7,518,222 B2
(45) Date of Patent: Apr. 14, 2009

(54) APPARATUS AND SYSTEM FOR AN IC SUBSTRATE, SOCKET, AND ASSEMBLY

(75) Inventors: Xiaoqing Ma, Gilbert, AZ (US); King Gonzalez, Gilbert, AZ (US); Stewart Ongchin, Phoenix, AZ (US); Stephen Tisdale, Gilbert, AZ (US); Vadim Sherman, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 468 days.

(21) Appl. No.: 11/394,855

(22) Filed: Mar. 30, 2006

(65) Prior Publication Data

US 2007/0228531 A1 Oct. 4, 2007

(51) Int. Cl.
*H01L 23/02* (2006.01)

(52) U.S. Cl. ........................ 257/678; 257/686; 257/737; 361/735; 361/760

(58) Field of Classification Search ................. 257/686, 257/678, 737, 738, 774; 361/735, 760, 761
See application file for complete search history.

(56) References Cited

U.S. PATENT DOCUMENTS

| | | | | |
|---|---|---|---|---|
| 5,975,915 | A * | 11/1999 | Yamazaki et al. | 439/72 |
| 6,347,946 | B1 * | 2/2002 | Trobough et al. | 439/70 |
| 6,648,654 | B1 * | 11/2003 | Akram et al. | 439/70 |
| 6,877,223 | B2 * | 4/2005 | Figueroa et al. | 29/884 |
| 7,183,194 | B2 * | 2/2007 | Farnworth | 438/621 |
| 2007/0296072 | A1 * | 12/2007 | Chandran et al. | 257/678 |

* cited by examiner

*Primary Examiner*—Phuc T Dang
(74) *Attorney, Agent, or Firm*—Buckley, Maschoff & Talwalkar LLC

(57) ABSTRACT

An apparatus and system including a substrate having a plurality of through-holes therethrough, and an integrated circuit (IC) socket frame to mount to the substrate. The IC socket frame may include a plurality of beam features, each extending from a socket frame body and corresponding in arrangement to the plurality of through-holes through the substrate.

17 Claims, 5 Drawing Sheets

500

APPARATUS AND SYSTEM FOR AN IC SUBSTRATE, SOCKET, AND ASSEMBLY

BACKGROUND

An integrated circuit (IC) package may be used to contain and electrically couple an IC die to external components and circuitry. According to some conventions, electrical contacts of an IC die are coupled to electrical contacts of a substrate of an IC package, which are in turn electrically coupled to external contacts of the IC package. The external contacts of the IC package may include a number of contacts arranged in any of a number of suitable patterns.

The external contacts may be attached, even removably so, to an IC socket that may in turn be coupled to other components such as, for example, a printed circuit board. Conventionally, the IC socket includes a socket frame defining an enclosed area within which a substrate carrying a die is received. The substrate is confined to fit within the interior area defined by the socket frame.

Accordingly, the size of the substrate is limited due to the constraints placed thereon by the size of the IC socket. In order to change the size of the substrate, the dimensions of the IC socket must be changed. A redesign and manufacture of an IC socket is a timely and costly enterprise. Additionally, there is a limited surface area available on the substrate to accommodate components other than the die.

DETAILED DESCRIPTION

The several embodiments described herein are solely for the purpose of illustration. Embodiments may include any currently or hereafter-known versions of the elements described herein. Therefore, persons skilled in the art will recognize from this description that other embodiments may be practiced with various modifications and alterations.

Figure 1:
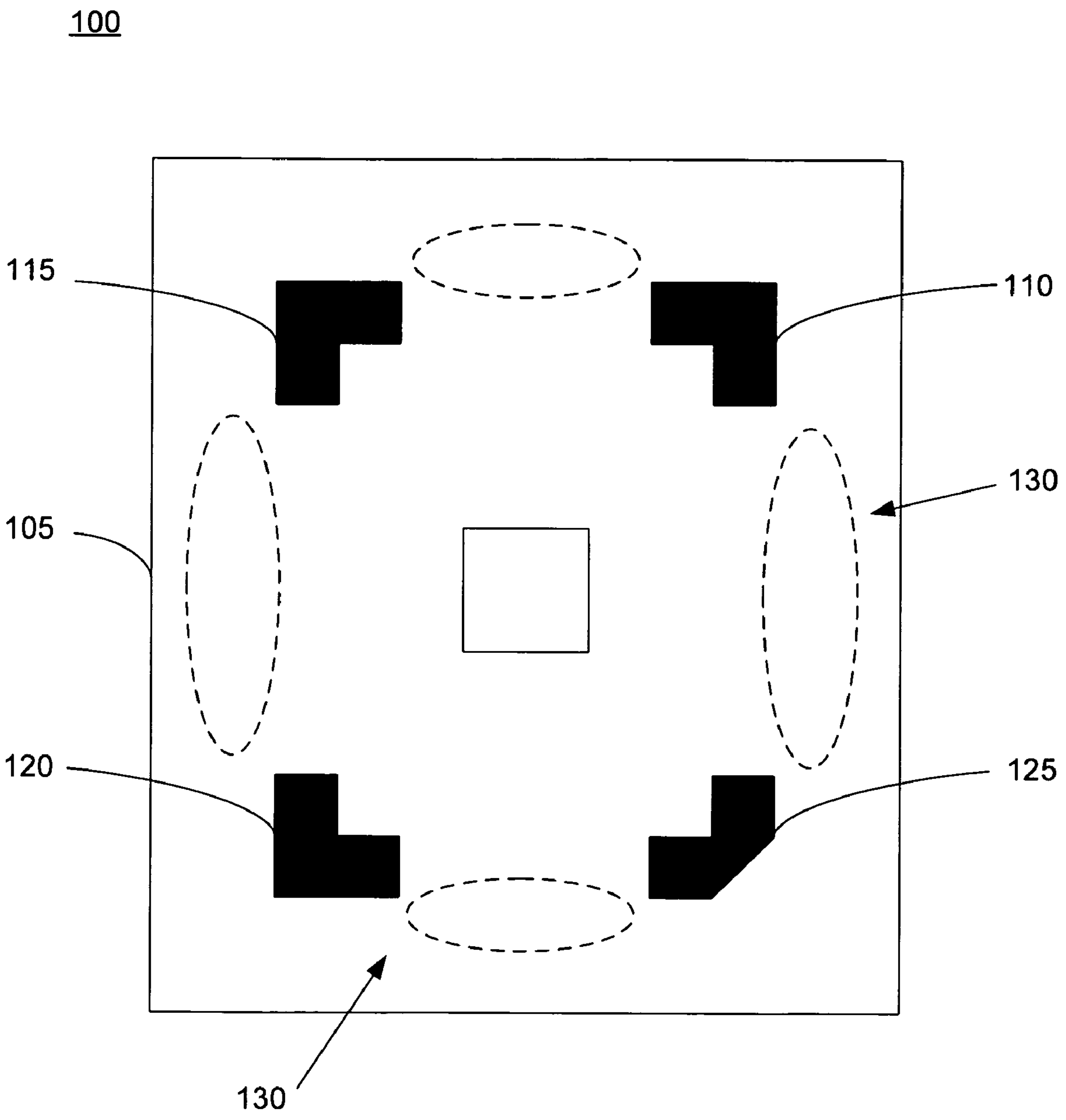
FIG. 1 is an exemplary illustration of an apparatus, in accordance with some embodiments herein.

FIG. 1 is an exemplary apparatus 100, in accordance with some embodiments herein. FIG.1 provides a depiction of substrate 105 having a number of through-holes 110, 115, 120, 125 therein. Through-holes 110, 115, 120, 125 extend from a first side of substrate 105 through the substrate to an opposing second side of the substrate. In some embodiments, at least one of the through-holes 110, 115, 120, 125 has an orientation feature incorporated therewith. Of the through-holes 110, 115, 120, 125, through-hole 125 includes the orientation feature. Through-holes 110, 115, and 120 have substantially the same shape.

The orientation feature of through-hole 125 includes a chamfered corner. In some embodiments, the orientation feature included with at least one of the plurality of through-holes in substrate 105 may include a distinguishing size, shape, and combinations thereof. For example, the orientation feature may include a larger or smaller opening, a different shaped opening such as "L"-shaped or not "L"-shaped, circular-shaped, triangular-shaped, rectangular-shaped, and other shapes. The orientation feature may include a combination of shapes and sizing options.

Through-holes 110, 115, 120, 125 may be created using any of a number of processes and techniques, including those techniques and processes compatible with IC manufacturing processes. For example, through-holes 110, 115, 120, 125 may be made using a drilling process, a laser ablation process, and any other suitable process.

In some embodiments, areas 130 on substrate 105 may be available for the mounting of components. Areas 130 on substrate 105 may be made available due to a lack of a conventional socket frame in the vicinity thereof. Beam features 110, 115, 120, 125 herein provide substrate alignment and retention functionality, without an IC socket frame or wall in areas 130. In some embodiments, a similar area(s) of useable substrate surface may be available on an underside of substrate 105.

Figure 2:
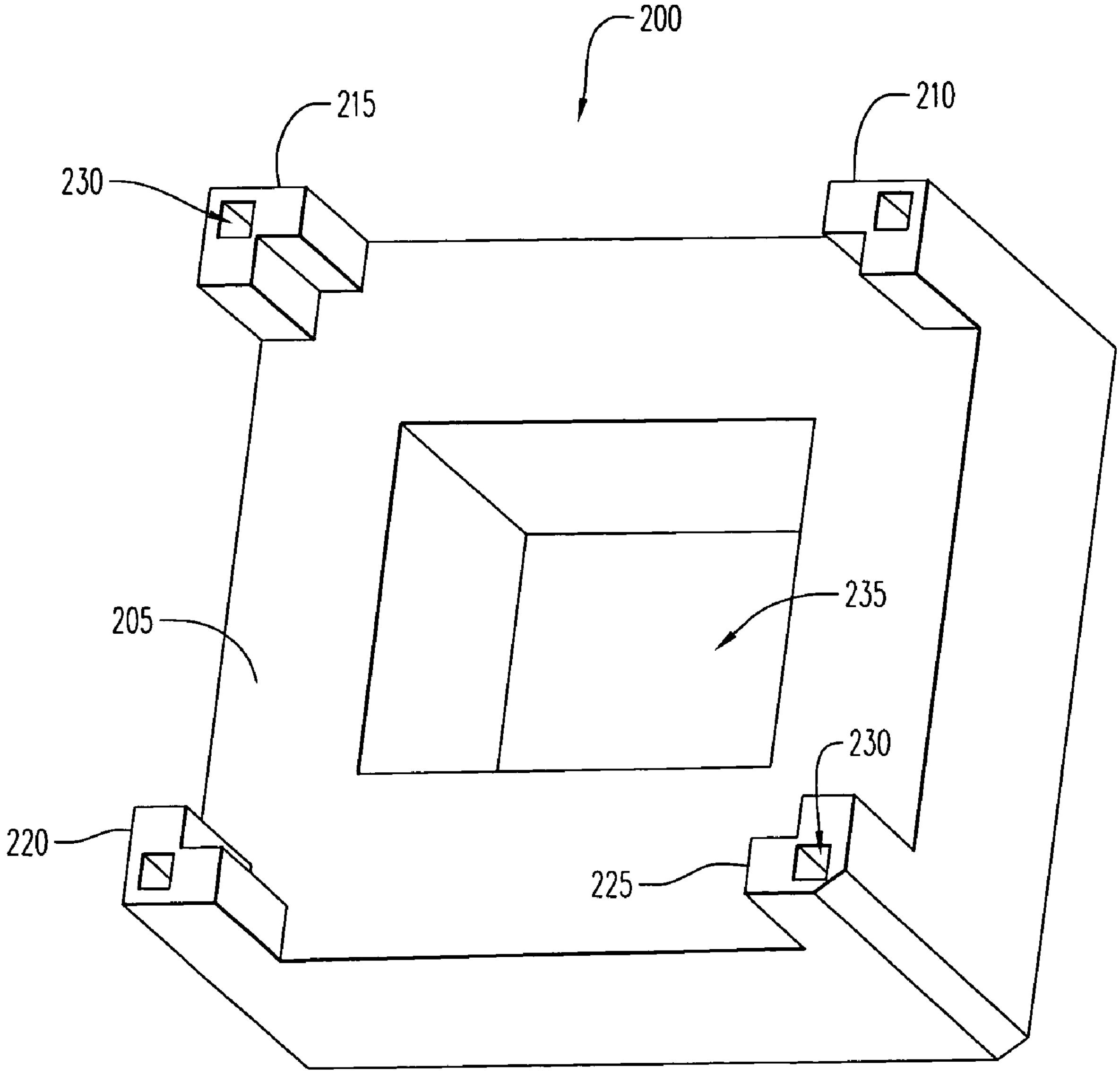
FIG. 2 is an exemplary illustration of an apparatus, in accordance with some embodiments herein.

FIG. 2 is an exemplary illustration of an apparatus 200, in accordance with some embodiments herein. Apparatus 200 is an IC socket frame including a socket body 205 and a plurality of beam features 210, 215, 220, 225. Each of beam features 210, 215, 220, 225 extends, in an upright direction, from socket body frame 205. One end of the beam features is in contact with socket body frame 205 and another opposing end is spaced apart from the socket body frame.

In some embodiments, beam features 210, 215, 220, 225 correspond to the plurality of through-holes 110, 115, 120, 125. In such instances, the orientation feature of the through-holes has a corresponding counterpart on the beam features. For example, beam feature 225 has a chamfered corner that corresponds and matches the chamfer of through-hole 125.

In some embodiments, beam features 210, 215, 220, 225 have through-holes 230 therein. The through-holes of the beam features may extend an entire length of the respective beam features. In some embodiments, the through-holes of the beam features may extend through the beam feature and further through the socket frame in an area in contact with the respective beam features.

In some embodiments, an array, matrix, or configuration of pin contacts (not shown) may be associated with IC socket frame 200. The matrix of pin contacts may be positioned in a pin contact area 235. The pin contacts my be positioned substantially even with an upper surface of socket body frame 205 or raised therefrom.

In some embodiments, the overall configuration of beam features 210, 215, 220, 225 may include an "L" shape, a circular shape, a triangular shape, rectangular shape, and other shapes to correspond to the shapes and sizes of through-holes 110, 115, 120, 125. In some embodiments, the shape and dimensions of the beam features and the substrate through-holes may be optimized through, for example, mechanical calculations and simulations of the beam's mechanical strength.

Figure 3:
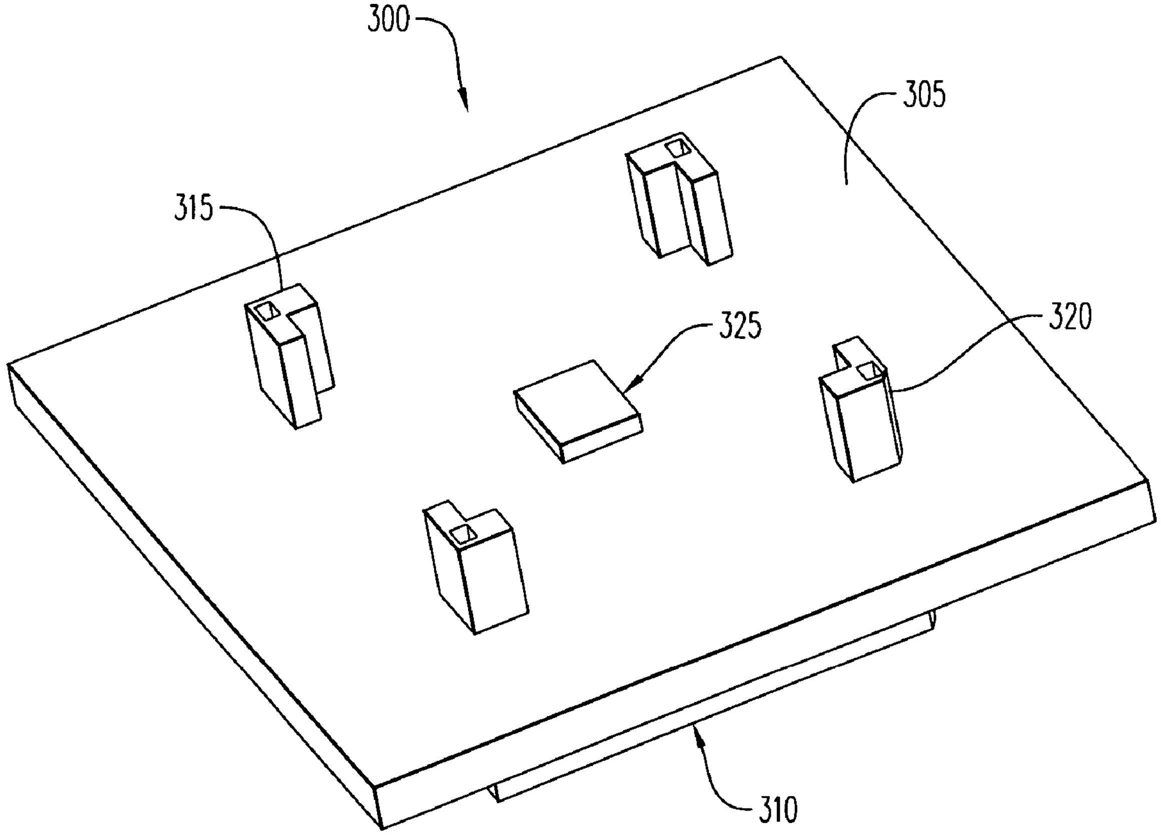
FIG. 3 is an exemplary illustration of a system, according to some embodiments herein.

FIG. 3 is an illustrative depiction of an apparatus 300 that includes a substrate 305 interfaced with an IC socket frame 310, in accordance with some of the embodiments herein. Beam features 315 (four shown, only one labeled) extend from a body frame of IC socket frame 310. In some embodiments, the beam features are located at opposing corners of IC socket frame 310. Beam features 315 are received in a number of through-holes in substrate 325. Beam features 315 extend above an upper surface of substrate 305 in FIG. 3. However, in some embodiments beam features 315 may be substantially even with or lower than the upper surface of substrate 305. A die 325 is shown positioned on substrate 305, over the pin contact area (not shown) of IC socket frame 310. A number of conductive contacts may be located on an underside of IC socket frame 310 to electrically couple the IC socket frame to, for example, a printed circuit board (PCB).

One of the beam features 315 has an orientation feature 320 thereon to orientate align substrate 305 onto IC socket frame 310 in the proper orientation. In this manner, substrate 305 may be efficiently and properly aligned with IC socket frame 310.

Figure 4:
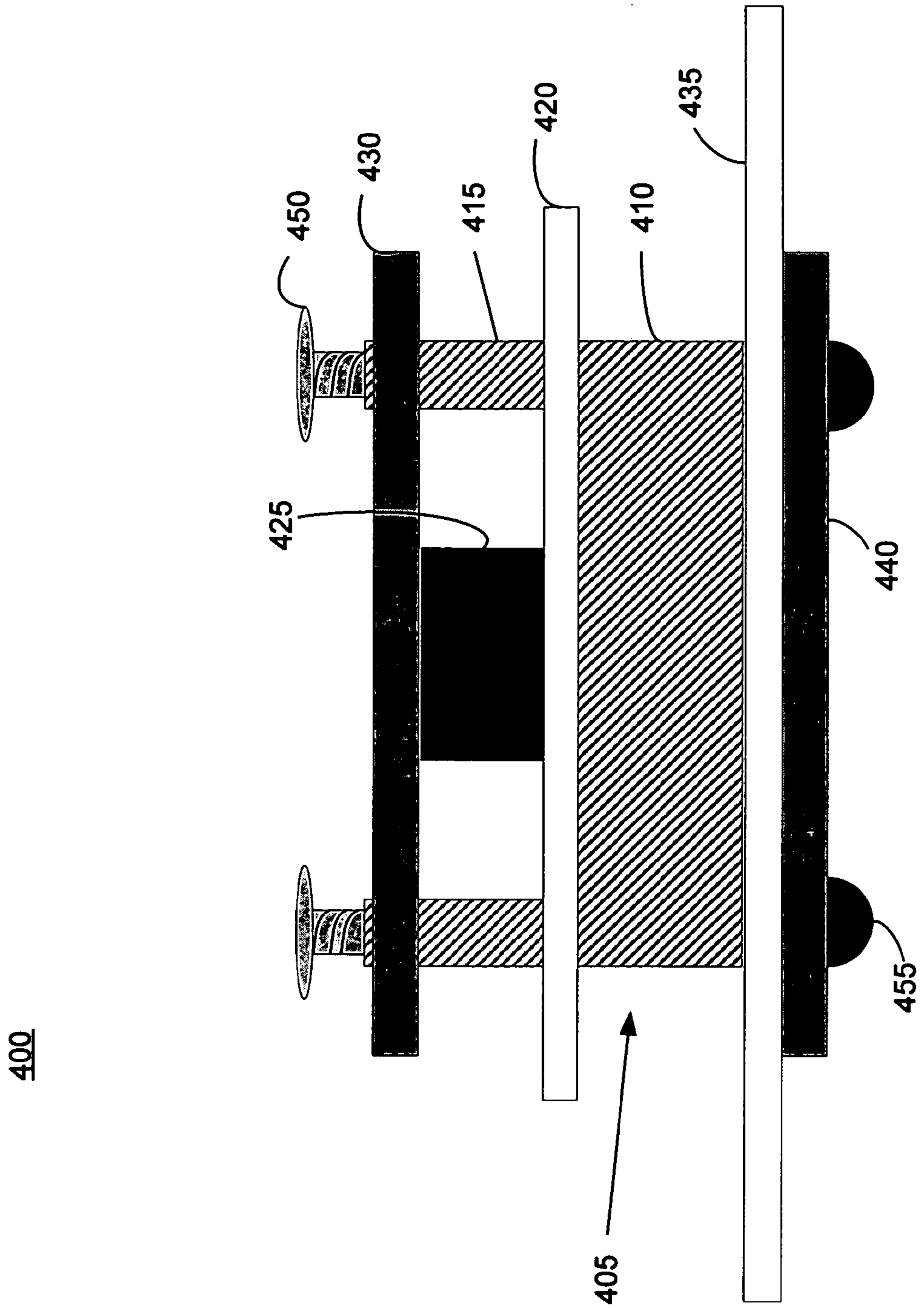
FIG. 4 is an exemplary illustration of a system, in accordance with some embodiments herein.

FIG. 4 is an illustrative depiction of a system including a substrate and an IC socket frame, in accordance with some aspects herein. System 400 includes an IC socket frame 405 having a socket frame body 410 and a number of beam features 415 extending therefrom. Beam features 415 may be located at corner locations of socket body frame 410. Substrate 420 is disposed on IC socket frame 405. At least one of beam features 415 may include an orientation feature to properly orientate substrate 420 on IC socket frame 405. Also shown is a die 425 connected to substrate 420. IC socket frame 405 is connected to PCB 425 by a number of contacts (not shown) on a bottom surface of IC socket frame 405.

FIG. 4 clearly illustrates an open area between beam features 415. This open area is available for the mounting of IC components, discrete electrical components, and an expanded or different die than die 425. The location of beam features 415 at discrete locations and an absence of a sidewall therebetween contributes to the availability and accessibility of areas of substrate 420.

A top plate 430 and a bottom plate 440 are held together by attachment mechanisms 450 (e.g., screws). Attachment mechanisms 450 may cooperate with through-holes in beam features 415 to apply a compressive force between top plate 430 and bottom plate 440. Attachment mechanisms 450, the screws, may engage with attachment components 455. Attachment components 455 may include a nut. In some embodiments, the force applied to die 425 may be selectively varied by an adjustment of attachment mechanisms 450.

Figure 5:
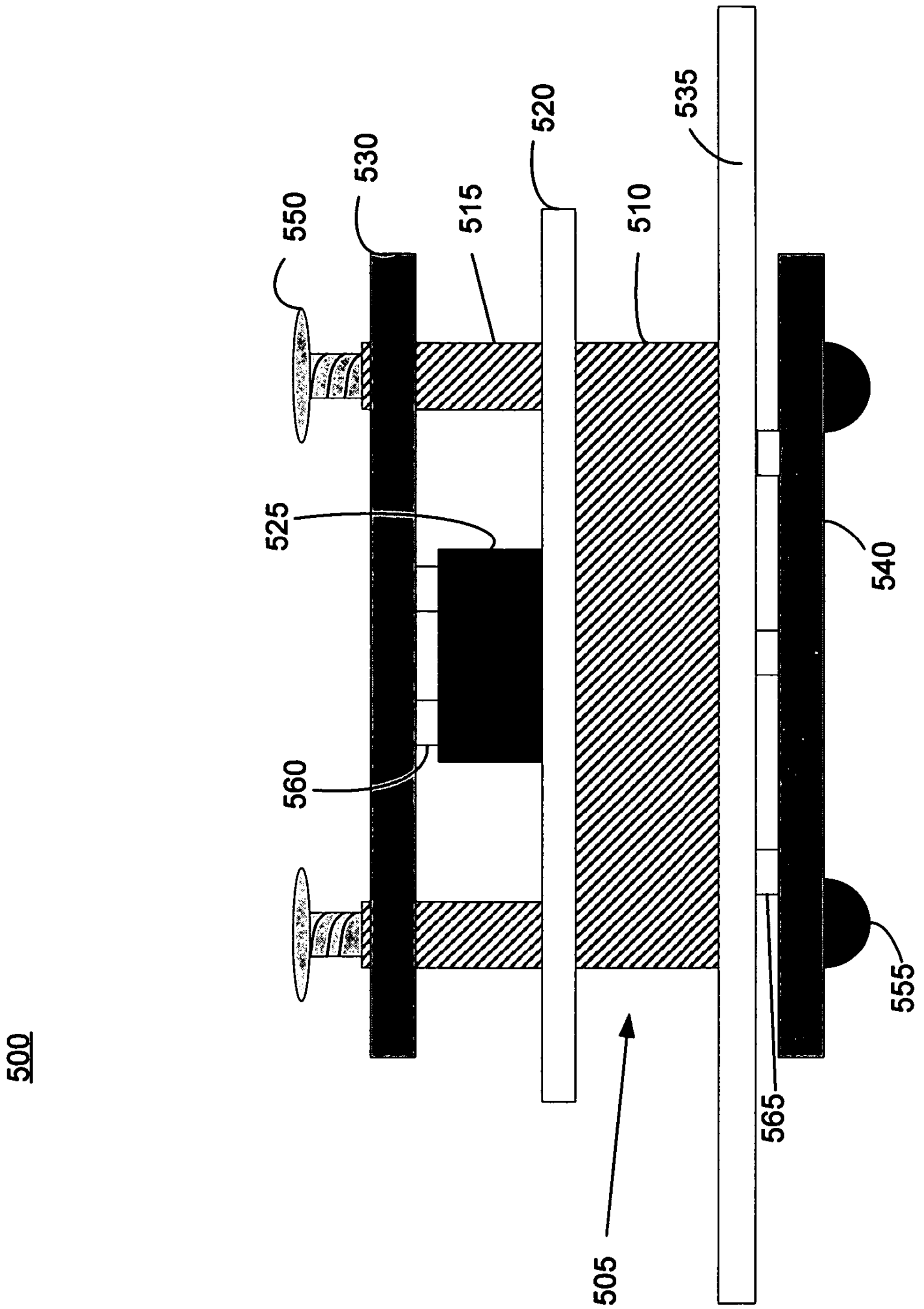
FIG. 5 is an exemplary illustration of a system, in accordance with some embodiments herein.

FIG. 5 is, in some aspects, similar to FIG. 4. System 500 includes an IC socket frame 505 having a socket frame body 510 and a number of beam features 515 extending therefrom. Substrate 520 is disposed on IC socket frame 505. Die 525 is connected to substrate 520. IC socket frame 505 is connected to PCB 525 by a number of contacts (not shown) on a bottom surface of IC socket frame 405.

FIG. 5 also includes a device 560 between top plate 530 and die 525. Device(s) 560 may include heat dissipation materials, devices, and systems to manage thermal energy in a vicinity thereof. Devices 560 may be passive or active thermal management devices and systems. The through-holes in beam features 515 facilitate an installation and alignment of devices 560 by providing, for example, an anchor point for the attachment mechanisms 450 that assist in positioning and retaining devices 560 in a desired location.

System 500 includes a device 565 between bottom plate 540 and PCB 535. Device(s) 565 may include heat dissipation materials, devices, and systems to manage thermal energy in a vicinity thereof. Hereto, the through-holes in beam features 515 facilitate an installation and alignment of devices 565 by providing, for example, an anchor point for the attachment mechanisms 550 that assist in positioning and retaining devices 565 in a desired location.

In some embodiments, devices 560 and 565 may be mechanical devices deployed to assist in the amount of force applied to die 525 and the other components. In some embodiments, devices 560 and 565 may include a spring, a semi-rigid material, etc.

The several embodiments described herein are solely for the purpose of illustration. Persons in the art will recognize from this description that other embodiments may be practiced with modifications and alterations limited only by the claims.

What is claimed is:

1. An apparatus, comprising:
a substrate having a plurality of through-holes therethrough; and
an integrated circuit (IC) socket frame to mount to the substrate, the IC socket frame comprising:
a socket frame body; and
a plurality of beam features, each of the plurality of beam features located at spaced apart discrete locations on the socket frame body without a connecting sidewall between the plurality of beam features, extending from the socket frame body, and corresponding in arrangement to the plurality of through-holes through the substrate, wherein at least one of the plurality of beam features includes an orientation feature to orientate the substrate to the IC socket frame.

2. The apparatus of claim 1, wherein the plurality of through-holes are shaped and sized to receive the plurality of beam features therethrough.

3. The apparatus of claim 1, wherein the plurality of through-holes and the plurality of beam features have corresponding mating shapes selected from the group of: an "L" shape, a circular shape, a triangular shape, a rectangular shape, and a combination of different shapes.

4. The apparatus of claim 1, wherein the plurality of beam features have a through-hole extending therethrough from a first end of the beam feature, to a second end of the beam feature, and through the socket frame body.

5. The apparatus of claim 1, wherein the plurality of beam features provide a mechanism to facilitate at least one of the following:
alignment and support of the substrate, alignment of an IC socket frame retention mechanism to the apparatus, and alignment of a thermal management mechanism to the apparatus.

6. The apparatus of claim 1, wherein the substrate further comprises at least one orientation feature to correspond to the orientation feature of the at least one of the plurality of beam features.

7. The apparatus of claim 1, further comprising an array of pin contacts on an upper region of the socket frame body to engage with a plurality of pins on the substrate.

8. The apparatus of claim 1, further comprising a plurality of conductive contacts on a lower surface of the socket frame body.

9. An integrated circuit (IC) socket frame to connect to a substrate, comprising:
a socket frame body; and
a plurality of beam features extending from the socket frame body, each of the plurality of beam features spaced apart from the others of the plurality of beam features without a connecting sidewall between the plurality of beam features and having a first end connected to an upper surface of the socket frame and a second end spaced apart from the socket frame body, wherein at least one of the plurality of beam features includes an orientation feature to orientate the substrate to the IC socket frame.

10. The IC socket frame of claim 9, wherein the plurality of beam features have a through-hole extending therethrough from the first end thereof to the second end thereof.

11. The IC socket frame of claim 10, wherein through-hole further extends through the socket frame body.

12. The IC socket frame of claim 9, wherein the plurality of beam features have an exterior shape selected from the group of: an "L" shape, a circular shape, a triangular shape, a rectangular shape, and a combination of different shapes.

13. The IC socket frame of claim 9, wherein the orientation feature is selected from the group of: a shape of the beam feature, a size of the beam feature, and combinations thereof.

14. The IC socket frame of claim 9, further comprising an array of pin contacts on an upper region of the socket frame body to engage with a plurality of pins of an IC.

15. A system comprising:

an integrated circuit (IC) substrate having a plurality of through-holes therethrough;

an socket frame to mount to the IC substrate, the socket frame comprising:

a socket frame body; and a plurality of beam features extending from the socket frame body, each of the plurality of beam features located at spaced apart discrete locations on the socket frame body without a connecting sidewall between the plurality of beam features and corresponding to the plurality of through-holes through the IC substrate, wherein at least one of the plurality of through-holes includes an orientation feature; and a double data rate memory electrically coupled to the IC substrate.

16. The system of claim 15, wherein at least one of the plurality of beam features includes an orientation feature.

17. The system of claim 15, further comprising a mechanism to retain the IC substrate in a fixed relationship with the socket frame.

* * * * *